US008945707B2

(12) United States Patent
Kanaoka et al.

(10) Patent No.: US 8,945,707 B2
(45) Date of Patent: Feb. 3, 2015

(54) SURFACE-COATED CUTTING TOOL

(75) Inventors: Hideaki Kanaoka, Itami (JP); Yoshio Okada, Itami (JP); Chikako Kojima, Itami (JP); Anongsack Paseuth, Itami (JP); Erika Iwai, Itami (JP); Hiroyuki Morimoto, Itami (JP)

(73) Assignee: Sumitomo Electric Hardmetal Corp., Itami-shi (JP)

( * ) Notice: Subject to any disclaimer, the term of this patent is extended or adjusted under 35 U.S.C. 154(b) by 172 days.

(21) Appl. No.: 13/582,358

(22) PCT Filed: Dec. 5, 2011

(86) PCT No.: PCT/JP2011/078086
§ 371 (c)(1),
(2), (4) Date: Aug. 31, 2012

(87) PCT Pub. No.: WO2012/153437
PCT Pub. Date: Nov. 15, 2012

(65) Prior Publication Data
US 2013/0101365 A1    Apr. 25, 2013

(30) Foreign Application Priority Data

May 10, 2011  (JP) ................. 2011-105226
May 10, 2011  (JP) ................. 2011-105227

(51) Int. Cl.
*C23C 16/44*     (2006.01)
*B23B 27/00*     (2006.01)
(Continued)

(52) U.S. Cl.
CPC .............. *B23B 27/00* (2013.01); *B23B 27/146* (2013.01); *C23C 30/005* (2013.01);
(Continued)

(58) Field of Classification Search
CPC ...... B23B 27/00; B23B 27/146; B23B 27/148
USPC ............ 51/307, 309; 428/336, 469, 472, 698, 428/701, 702, 704
See application file for complete search history.

(56) References Cited

U.S. PATENT DOCUMENTS 5,123,934 A * 6/1992 Katayama et al. .............. 51/309
6,187,421 B1 * 2/2001 Moriguchi et al. ........... 428/336
(Continued)

FOREIGN PATENT DOCUMENTS

| JP | 06-246513 | * | 9/1994 |
| JP | 7-241704 | | 9/1995 |
| JP | 8-257809 | | 10/1996 |
| JP | 2000-212743 | | 8/2000 |
| JP | 2003-071612 | | 3/2003 |
| JP | 2008-238392 | | 10/2008 |
| KR | 101014698 B1 | | 2/2011 |
| WO | WO-2011/018917 A1 | | 2/2011 |

OTHER PUBLICATIONS

Office Action in Chinese Patent Application No. 201180016264.0, dated Feb. 27, 2014.
Office Action in Korean Patent Application No. 10-2012-7023483, dated Jun. 30, 2014.

* cited by examiner

*Primary Examiner* — Archene Turner
(74) *Attorney, Agent, or Firm* — Venable LLP; Michael A. Sartori; Tamatane J. Aga (57) ABSTRACT

The surface-coated cutting tool of the present invention is characterized in that a region of 10 μm in a surface of the base material from point a' to point b' has two to seven cracks with a width of not more than 200 nm, or two to ten pores are present per length of 10 μm in the surface of the base material from point a' to point b', where points a' and b' are points defined respectively by lines drawn perpendicularly from points a and b to the surface of the base material where point a is a position located away from an edge ridgeline toward a rake face by distance La and point b is a position located away from the edge ridgeline toward a flank face by distance Lb.

10 Claims, 2 Drawing Sheets

(51) Int. Cl.
  *B23B 27/14*  (2006.01)
  *C23C 30/00*  (2006.01)
  *C23C 16/02*  (2006.01)
  *C23C 16/30*  (2006.01)
  *C23C 28/04*  (2006.01)
(52) U.S. Cl.
  CPC .......... *B23B 27/148* (2013.01); *C23C 16/0254* (2013.01); *C23C 16/30* (2013.01); *C23C 28/042* (2013.01); *C23C 28/044* (2013.01)

USPC ............... 428/336; 51/307; 51/309; 428/469; 428/472; 428/698; 428/701; 428/702

(56) References Cited

U.S. PATENT DOCUMENTS

2008/0160338 A1*  7/2008  Tanibuchi et al. ......... 428/411.1
2009/0211414 A1*  8/2009  Fukano ......................... 428/155
2011/0250394 A1  10/2011  Yoshida et al.

SURFACE-COATED CUTTING TOOL

TECHNICAL FIELD

The present invention relates to a surface-coated cutting tool including a base material and a coating formed on the base material.

BACKGROUND ART

The cemented carbide has conventionally been used for cutting steel and cast iron. The cemented carbide is a WC—Co alloy or a WC—Co alloy to which a carbonitride of Ti, Ta, or Nb is added. It has a problem, however, that the temperature of the edge of the cutting tool becomes a high temperature of 800° C. or more in a cutting process, which causes the edge to be plastically deformed due to the heat in the cutting process and makes it more likely that flank wear increases.

Thus, in order to improve the cutting characteristics of the cutting tool under a high temperature condition, a coated cutting tool has been used that is formed of the above-described cemented-carbide base material and a coating formed on the surface of the cemented-carbide base material. The coating is formed of a single layer or a composite layer of a carbide, a nitride, or a carbonitride of a group IVa metal in the periodic table (such as TiC, TiN, or TiCN) or a hard ceramic such as $Al_2O_3$. These coatings are formed by means of chemical vapor deposition such as CVD or physical vapor deposition such as ion plating or ion sputtering. A coating formed by means of CVD or the like has an advantage that its strength of adhesion to the cemented-carbide base material is very high and its wear resistance is highly excellent.

Meanwhile, CVD deposits the coating in a high temperature state of approximately 1000° C., and therefore, when the deposited coating is cooled to room temperature, tensile stress remains in the coating due to a difference in thermal expansion coefficient between the cemented-carbide base material and the coating. Consequently, if a crack opens in the surface of the coating in the cutting process, the tensile stress causes the crack to propagate, resulting in dropping off or chipping of the coating. It is noted that the cemented-carbide base material has a thermal expansion coefficient of approximately $5.1 \times 10^{-6} K^{-1}$, and a coating made of TiN has a thermal expansion coefficient of approximately $9.2 \times 10^{-6} K^{-1}$. Further, a coating made of TiC has a thermal expansion coefficient of approximately $7.6 \times 10^{-6} K^{-1}$ and a coating made of $Al_2O_3$ has a thermal expansion coefficient of approximately $8.5 \times 10^{-6} K^{-1}$.

Because of the recent demands for higher cutting speed and higher cutting efficiency, the coating tends to be made thicker. It is therefore necessary to further improve the adhesive strength between the cemented-carbide base material and the coating. The cutting tools that are now generally used have a thickness of the coating of about a few μm to ten and several μm. While the wear resistance is improved as the thickness of the coating is made larger, an excessively large thickness of the coating may make it more likely that an abnormal damage occurs to the tool, or the tensile stress resulting from a difference in thermal expansion efficiency may make it more likely that an abnormal damage occurs to the cutting tool. If the coating accordingly peels off from the base material, abnormal wear will occur which shortens the life of the cutting tool or deteriorates the fracture resistance.

An attempt has also been made to improve the fracture resistance by honing the edge after the base material is mechanically polished. If the surface of the base material is polished, however, a crack may occur to the interface between hard phases or the interface between a hard phase and a binder phase, or a polishing swarf may stick, which causes the adhesive strength of the coating to deteriorate. Peeling of the coating from the base material will lead to an unexpected fracture and a shortened life of the cutting tool.

In view of the above, various attempts have been made to improve the adhesive strength of the coating. For example, according to Japanese Patent Laying-Open No. 2000-212743 (PTL 1), electrolytic polishing, rather than mechanical polishing, is performed on the surface of the base material to thereby eliminate cracks in grains of the hard phase due to mechanical polishing and improve the strength of adhesion of the coating to the base material.

Japanese Patent Laying-Open No. 2008-238392 (PTL 2) discloses a technique of controlling the direction of crystal growth of the coating, according to which shot blasting is performed after brush polishing to thereby smooth a hard phase portion of the base material surface, and then a binder phase portion is removed to form a depression. The coating can thus be formed to control the direction of crystal growth of the columnar structure in the coating and enhance the toughness of the coating.

CITATION LIST

Patent Literature

PTL 1: Japanese Patent Laying-Open No. 2000-212743
PTL 2: Japanese Patent Laying-Open No. 2008-238392

SUMMARY OF INVENTION

Technical Problem

The surface-coated cutting tool disclosed in PTL 1, however, has a problem that the adhesive strength is weak in the case where cutting is performed intermittently in high-speed machining and high-efficiency machining. In the case where the surface-coated cutting tool disclosed in PTL 2 is used to perform cutting intermittently in high-speed machining and high-efficiency machining, stress in the cutting process is concentrated on the depression formed by removing a part of the binder phase. Resultant problems are that the wear occurs irregularly and the wear resistance is likely to deteriorate and that an unexpected fracture is likely to occur. These problems occur generally to the cutting tools if the cutting tools are used to perform cutting intermittently in high-speed machining and high-efficiency machining. Among others, the above-described problems are each likely to occur particularly to the cutting tool for use in an application where a load is intermittently applied, like milling or machining of a grooved workpiece.

The present invention has been made in view of the present circumstances as described above, and an object of the invention is to provide a surface-coated cutting tool excellent in strength of adhesion between the base material and the coating and also excellent in wear resistance or fracture resistance.

Solution to Problem

A surface-coated cutting tool of the present invention includes a base material and a coating formed on the base material. The base material has a hard phase and a binder phase binding the hard phases to each other. The coating is formed of a single layer or a plurality of layers. La is less than 0.2 mm and Lb is less than 0.1 mm, where point a is a position located away from an edge ridgeline toward a rake face by a distance of the La and point b is a position located away from the edge ridgeline toward a flank face by a distance of the Lb in a cross section of the surface-coated cutting tool cut along a plane including a normal to a surface of the coating at a center of the rake face and a geometric edge where two flank faces intersect; and a region of 10 μm in a surface of the base material from point a' to point b' has two to seven cracks with a width of not more than 200 nm, or two to ten pores are present per length of 10 μm in the surface of the base material from the point a' to the point b', where the point a' is a point on the surface of the base material that is located perpendicularly from the point a and the point b' is a point on the surface of the base material that is located perpendicularly from the point b. The pore is a cavity with a diameter gradually decreasing toward an interface between the base material and the coating, and the pore has a diameter in the interface of 0.08 to 3 μm.

The above-described La is preferably less than 0.1 mm, and the above-described Lb is preferably less than 0.05 mm. Preferably, a region of 10 μm in the surface of the base material from the point a' to the point b' has three to five cracks. Preferably, two to six pores are present per region with a length of 10 μm in the surface of the base material from the point a' to the point b'.

Preferably, the coating is formed of a compound of at least one element selected from the group consisting of group IVa elements, group Va elements, group VIa elements in the periodic table, Al, and Si, and at least one element selected from the group consisting of carbon, nitrogen, oxygen, and boron. Preferably, the coating has a thickness of not less than 3 μm and not more than 30 μm.

Preferably, the hard phase is formed of tungsten carbide and at least one compound selected from the group consisting of a carbide, a nitride, and a carbonitride of a group IVa element, a group Va element, or a group VIa element in the periodic table, or formed of tungsten carbide. Preferably, the binder phase is formed of at least one element selected from the group consisting of iron, cobalt, and nickel.

Advantageous Effects of Invention

The surface-coated cutting tool of the present invention is configured in the above-described manner to thereby exhibit the effects that the strength of adhesion between the base material and the coating is excellent and the wear resistance or fracture resistance is excellent.

DESCRIPTION OF EMBODIMENTS

<Surface-Coated Cutting Tool>

A surface-coated cutting tool of the present invention includes a base material and a coating formed on the surface of the base material. The surface-coated cutting tool of the present invention having such a structure can be used advantageously as, for example, an indexable insert for drilling, end-milling, milling, machining, pin-milling of a crankshaft, or the like. The surface-coated cutting tool of the present invention, however, is not limited to these uses and shapes. The surface-coated cutting tool of the present invention is particularly suitable for use in a cutting process where an intermittent load is applied, such as milling and machining of a grooved workpiece.

<Base Material>

As the base material of the surface-coated cutting tool of the present invention, any conventionally known base material which is known as a base material of such a cutting tool may be used without being particularly limited. For example, cemented carbide (including, for example, WC-based cemented carbide, the one containing WC and Co, and the one containing WC and Co and additionally a carbonitride of Ti, Ta, Nb or the like), cermet (having TiC, TiN, TiCN or the like as a main component), high-speed steel, ceramic (such as titanium carbide, silicon carbide, silicon nitride, aluminum nitride, aluminum oxide, and a mixture thereof), cubic boron nitride sintered body, diamond sintered body, and the like, may be examples of such a base material.

The base material of the present invention preferably has a structure that includes a plurality of hard phases (normally forming a matrix) made of a hard compound and a binder phase binding the hard phases to each other, and is more preferably a cemented carbide manufactured by sintering, for example, powder of a metal carbide which is a hard compound.

Here, the above-described hard phase is preferably made up of, for example, at least one compound and tungsten carbide. The at least one compound refers to at least one compound selected from the group consisting of a carbide, a nitride, and a carbonitride of at least one element belonging to one of group IVa elements, group Va elements, and group VIa elements in the periodic table. Alternatively, the hard phase is preferably tungsten carbide only. Specific examples of at least one compound selected from the group consisting of a carbide, a nitride, and a carbonitride of at least one element belonging to one of group IVa elements, group Va elements, and group VIa elements in the periodic table may be TiC, TiN, TaC, NbC, ZrCN, $Cr_3C_2$, ZrC, ZrN, TiCN, and the like. The ratio between respective contents of the compound and the tungsten carbide is not particularly limited. In the case where two or more of the above-mentioned compounds are blended, the ratio between respective contents of the compounds is not particularly limited as well. As these ratios, conventionally-known ratios between the contents may be used respectively. It is noted that the hard phase may be made of a cermet or the like instead of the above-listed hard compounds.

The hard phase formed of the compound as described above is hard and excellent in wear resistance, and its hardness is less likely to decrease even under a high temperature condition. This is therefore suitable for use as a material for the base material of the surface-coated cutting tool of the present invention.

The binder phase has a function of binding the hard phases to each other and is preferably formed of at least one element selected from the group consisting of iron-group metals, namely iron, cobalt, and nickel. The binder phase made of an iron-based element has a property of reinforcing binding between hard phases made of a metal carbide. It is noted that, in the case where the hard phase is made of a cermet, the binder phase is preferably cobalt, nickel, or an alloy of cobalt and nickel.

Regarding the present invention, in the case where a cemented carbide is used as the base material, the effects of the present invention are still exhibited even if such a cemented carbide includes free carbon or abnormal phase called η phase in its structure. It is noted that the base material used for the present invention may have its surface reformed. For example, in the case of cemented carbide, a β-free layer may be formed in its surface. In the case of cermet, a surface-hardened layer may be formed. Even if the surface is thus reformed, the effects of the present invention are still exhibited.

<Coating>

The coating of the present invention is formed of one layer or a plurality of layers. Namely, the coating may be a single layer or a composite layer made up of multiple layers. Such a coating is formed on the surface of the base material to thereby improve the wear resistance. In particular, the coating formed of one layer provides the effect that the number of interfaces between layers is decreased and the chipping resistance is improved.

The coating of the present invention includes an embodiment in which the coating covers the whole surface of the base material, includes an embodiment in which the coating partially fails to be formed, and further includes an embodiment in which the manner of stacking layers of the coating is different in a specific portion of the surface-coated cutting tool.

As the coating of the present invention, a coating of a conventionally-known composition may be used without being particularly limited. Preferably the coating is formed, for example, of a hard ceramic, particularly a compound of at least one element selected from the group consisting of group IVa elements, group Va elements, group VIa elements in the periodic table, Al, and Si, and at least one element selected from the group consisting of carbon, nitrogen, oxygen, and boron. Thus, the wear resistance can further be improved.

A specific example of such a compound may be at least one compound selected from the group consisting of carbide, nitride, carbonitride, oxide, carbo-oxide, carbo-oxy-nitride, boro-nitride, and boro-carbo-nitride of at least one element selected from the group consisting of group IVa elements, group Va elements, group VIa elements in the periodic table, Al, and Si. Specific examples of the compound may be TiC, TiCN, TiN, TiSiN, TiSiCN, TiCNO, TiHfN, TiNbN, TiTaN, TiAlN, TiAlCrN, TiAlSiN, TiAlSiCrN, TiBN, TiAlBN, TiSiBN, TiBCN, TiAlBCN, TiSiBCN, CrN, AlN, AlCrN, $Al_2O_3$, ZrN, ZrCN, $ZrO_2$, VN, $TiO_2$ and the like. In particular, TiC, TiN, TiCN, or $Al_2O_3$ may suitably be used.

Such a coating is preferably not less than 3 μm and not more than 30 μm (which is the thickness of the whole coating in the case where the coating is constituted of multiple layers), and more preferably not less than 7 μm and not more than 23 μm. This thickness can be 3 μm or more to thereby provide the effect that the wear resistance of the coating is improved. As the thickness of the coating is greater, the wear resistance is improved to a greater extent. In contrast, the coating may have a thickness of 30 μm or less to ensure the fracture resistance of the coating.

<Features of Edge Ridgeline Portion>

Figure 1:
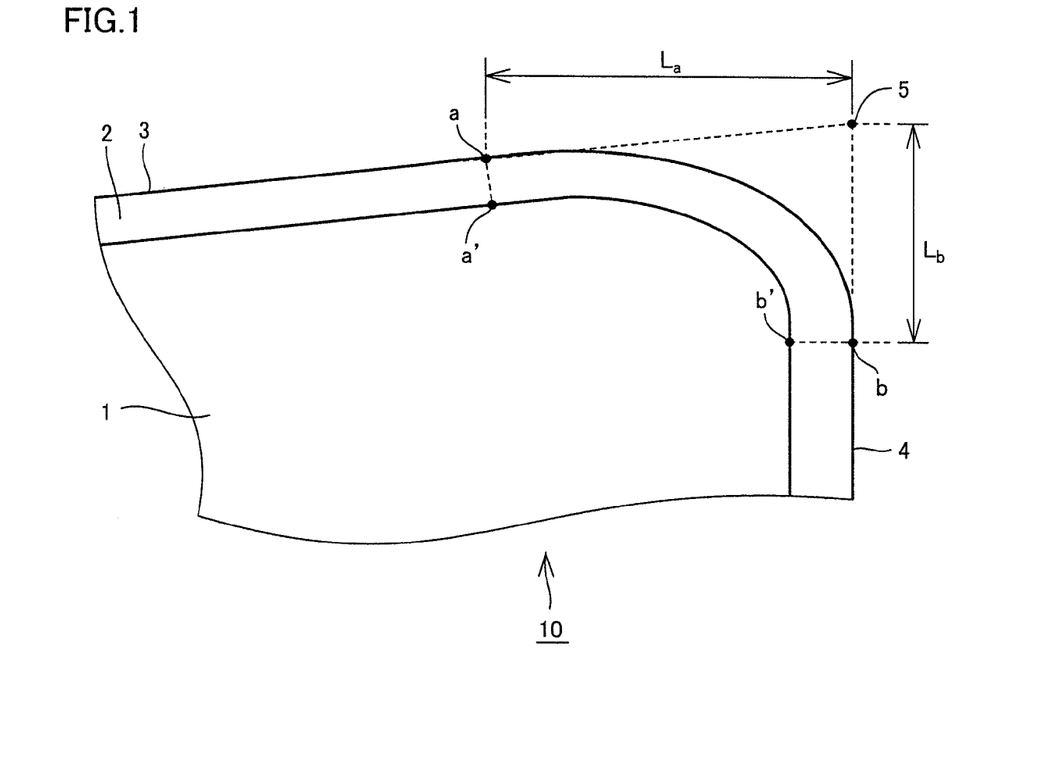
FIG. 1 is a schematic cross section of an edge ridgeline portion and therearound of a surface-coated cutting tool of the present invention obtained by cutting the surface-coated cutting tool along a plane which includes a normal to the coating surface at the center of the rake face and a geometric edge where two flank faces intersect.

FIG. 1 is a schematic cross section of an edge ridgeline portion and therearound of the surface-coated cutting tool of the present invention obtained by cutting the surface-coated cutting tool along a plane which includes a normal to the coating surface at the center of the rake face and a geometric edge where two flank faces intersect. The surface-coated cutting tool of the present invention includes a base material 1 and a coating 2 formed on the base material 1 as described above.

As shown in FIG. 1, in the cross section obtained by cutting the surface-coated cutting tool of the present invention along a plane which includes a normal to the surface of coating 2 at the center of a rake face 3 and a geometric edge where two flank faces 4 intersect, La is less than 0.2 mm and Lb is less than 0.1 mm where point a is a position located away from an edge ridgeline 5 toward the rake face by distance La and point b is a position located away from edge ridgeline 5 toward the flank face by distance Lb, and a region of 10 μm in a surface of base material 1 from point a' to point b' has two to seven cracks with a width of 200 nm or less, where point a' is a position on the surface of base material 1 that is located perpendicularly from point a and point b' is a position on the surface of base material 1 that is located perpendicularly from point b. Since such cracks with a very small width are present in the surface of the base material, the surface area of coating 2 abutting on base material 1 is increased, and therefore, the force of adhesion of the coating can be increased by the anchoring effect. Consequently, fracture due to flaking of the coating can be prevented while the wear resistance is improved by the coating, and the surface-coated cutting tool excellent in both the wear resistance and the fracture resistance can be obtained. Preferably, the number of the above-described cracks is three to five in a region of 10 μm in the surface of base material 1.

The width of the above-described crack is preferably 20 nm or more, since crack with a width of less than 20 nm cannot adequately provide the above-described anchoring effect. The width of the crack is more preferably not less than 50 nm and not more than 100 nm. If the width of the crack is larger than 200 nm, the crack at the interface between hard phases or the interface between the hard phase and the binder phase expands or a polishing swarf sticks, for example, to cause the adhesion strength of the coating to deteriorate, which is thus not preferred. If the number of cracks with a width of 200 nm or less is one or less, the anchoring effect cannot adequately be obtained and the adhesion strength decreases. The number of cracks of eight or more may foster integration of the cracks, possibly resulting in an unexpected fracture. The depth of the crack is preferably not less than 0.02 μm and not more than 10 μm, and more preferably not less than 0.05 μm and not more than 6 μm. If the depth of the crack is less than 0.02 μm, the cracks may not contribute to the anchoring effect. If the depth of the crack is larger than 10 μm, a fracture originating from the crack is likely to occur.

Further, according to the present invention, two to ten pores are present per region of 10 μm in length in the surface of the base material from point a' to point b'. The pore is a cavity having its diameter gradually decreasing toward the interface between the base material and the coating. The pore in the interface may have a diameter of 0.08 to 3 μm. The number of such pores is preferably two to six. Since such pores of a very small diameter are present in the surface of the base material, stress concentration on the cracks is alleviated by the pores even if cracks opened in the cutting process expand, and therefore the toughness can be increased. Consequently, fracture due to flaking of the coating can be prevented while the wear resistance of the coating is improved, and the surface-coated cutting tool excellent in both the wear resistance and the fracture resistance can be obtained. While the present invention is thus characterized in that a region of an arbitrary length of 10 μm in the surface of the base material from point a' to point b' has two to ten pores, preferably all regions of 10 μm in length in the surface of the base material each include two to ten pores. It is noted that "pore" of the present invention includes not only a cavity with its diameter gradually decreasing toward the interface between the base material and the coating but also a cavity with a uniform diameter toward the interface between the base material and the coating. As for "crack", "crack" refers to a cavity with its diameter gradually increasing from inside the base material toward the interface between the base material and the coating.

If the pore has a diameter of less than 0.08 μm, the pore cannot exhibit the function of alleviating stress concentration on the cracks and the fracture resistance deteriorates. If the pore has a diameter of larger than 3 μm, the adhesion strength of the coating decreases, which may possibly result in an unexpected fracture. In the case where the number of pores per region of 10 μm in length is one or less, expansion of cracks opened in the cutting process cannot be suppressed, possibly resulting in deteriorated fracture resistance. If 11 or more pores are present per region of 10 μm in length, the force of adhesion of the coating decreases, possibly resulting in flaking of the coating. Further, the depth of the pore is preferably not less than 0.01 μm and not more than 10 μm, and is more preferably not less than 0.05 μm and not more than 5 μm. If the pore's depth is less than 0.01 μm, the pore cannot exhibit the effect of suppressing expansion of cracks. If the pore's depth is larger than 10 μm, the adhesion strength of the coating decreases, which is thus not preferred.

Here, "edge ridgeline" and "edge ridgeline portion" of the present invention refer to respective concepts different from each other. "Edge ridgeline" refers to a geometric edge where rake face 3 and flank face 4 intersect in the above-defined cross section of surface-coated cutting tool 10 (having coating 2 formed on the surface of base material 1) of the present invention. Actually, however, such a geometric edge has been processed by honing and therefore fails to exist. Thus, according to the present invention, rake face 3 and flank face 4 in the cross section are approximated respectively by straight lines as shown in FIG. 1, the straight lines are extended and edge ridgeline 5 is defined as the intersection of the extended lines. In contrast, "edge ridgeline portion" is one of the portions most involved in cutting of a workpiece in the cutting process, and refers to a peripheral portion of the above-defined edge ridgeline 5. According to the present invention, the edge ridgeline portion (which may simply be referred to as "cutting edge" by the present invention) is a region defined in the following way. Namely, in the aforementioned cross section, rake face 3 and flank face 4 are approximated respectively by straight lines, and a region defined by connecting the points where the straight lines are inflected by the honing process (namely the region from the point of inflection of rake face 3 on the surface of coating 2 to the point of inflection of flank face 4 thereon) is the edge ridgeline portion. It is noted that while the above-defined point a and point b are preferably made coincident respectively with the point of inflection of rake face 3 and the point of inflection of flank face 4, the state where they fail to coincide with each other is not beyond the scope of the present invention.

Regarding the above-defined plane, "the center of the rake face" means the geometric center of the rake face. In the case where a through hole for attaching the surface-coated cutting tool is opened in a central portion of the rake face, "the center of the rake face" means the geometric center of the rake face supposing that the through hole is not opened. Further, "geometric edge where two flank faces intersect" means a geometric edge where two flank faces intersect. In the case, however, where this geometric edge does not form a distinct geometric edge, it means a hypothetical geometric edge where the two flank faces that are geometrically extended intersect. It is noted that in the case where two or more planes defined in the above-described manner are present in one surface-coated cutting tool, any one of the planes is selected.

Further, according to the present invention, as shown in FIG. 1, La is less than 0.2 mm and Lb is less than 0.1 mm, where the position on the surface of coating 2 in the cross section that is located away from edge ridgeline 5 toward rake face 3 by distant La is defined as point a and the position thereon that is located away from edge ridgeline 5 toward flank face 4 by distance Lb is defined as point b. Accordingly, the strength of the cutting edge of the portion which is most involved in cutting can be reinforced. Consequently, the coating can be prevented from dropping off or being chipped while the wear resistance is improved by the coating, and thus the excellent wear resistance and the excellent fracture resistance can be obtained.

In the case where the above-defined La is 0.2 mm or more, or the above-defined Lb is 0.1 mm or more, the adhesion between the coating and the base material decreases. Therefore, this La is more preferably less than 0.1 mm and this Lb is more preferably less than 0.05 mm.

<Method for Manufacture>

The surface-coated cutting tool of the present invention may be manufactured for example in the following way. First, a base material including a plurality of hard phases made of a hard compound and a binder phase binding the hard phases to each other is prepared. Subsequently, on this base material, a brush or plastic medium is used to perform honing of a portion corresponding to the edge ridgeline of the base material. After honing, shot peening is used to cause media such as alumina to impact against the base material. This shot peening can be performed to thereby open a pre-crack for forming a crack having a width of 200 nm or less in the coating, or form a nucleus for forming a pore having a diameter of 0.08 to 3 μm in the surface of the base material. Regarding shot peening, in order to facilitate opening of fine cracks, media made of a material of a relatively high hardness are preferably used, and media made for example of SiC, TiC, diamond or the like are appropriate. In terms of the fact that the shot peening easily produces a nucleus for forming a pore and causes less damage to the base material, media made of a relatively low hardness is preferably used, and a material made of alumina, zirconia, or the like is appropriate, for example.

Subsequently, the base material is immersed in an alcohol liquid and ultrasonic waves are applied to the surface of the base material. When the frequency of the ultrasonic waves is set to 25 kHz, the output of the ultrasonic waves is preferably adjusted to 300 to 600 W and the process time is preferably 5 to 15 minutes. The ultrasonic process can be performed under these conditions to thereby form two to seven cracks having a width of 200 nm or less in a region of 10 μm in the surface of the base material, and accordingly increase the strength of adhesion between the base material and the coating. It is noted that not only the above-described cracks but also fine pores may be present in the surface of base material 1, which does not go beyond the present invention and still exhibits the effects of the present invention.

In contrast, if the above-described ultrasonic process is not performed, cracks of 200 nm or less cannot be formed in the surface of the base material and the strength of adhesion between the base material and the coating cannot be improved. Further, if the output of the ultrasonic waves is less than 300 W or the ultrasonic process time is shorter than five minutes, the number of cracks formed in a region of 10 μm in the surface of the base material is one or less and the desired anchoring effect cannot be adequately obtained. If the output of the ultrasonic waves is larger than 600 W or the ultrasonic process time is longer than 15 minutes, the number of cracks formed in the surface of the base material is larger than eight and thus the fracture resistance may be deteriorated.

The output of the ultrasonic waves may be adjusted to 600 to 900 W and the frequency of the ultrasonic waves may be set to 25 kHz to perform the process for a process time of approximately 10 to 30 minutes. The ultrasonic process can be performed under these conditions to thereby form a pore having a diameter of 0.08 to 3 μm in the surface of the base material and accordingly increase the strength of adhesion between the base material and the coating. It is noted that not only the above-described pores but also cracks having a width of 200 nm or less may be present in the surface of base material 1, which does not go beyond the present invention. In contrast, if this ultrasonic process is not performed, the above-described pores cannot be formed in the surface of the base material and therefore the strength of adhesion between the base material and the coating as well as the fracture resistance are not improved.

Then, a coating is formed on the surface of the base material. The coating is formed on the base material by, for example; placing the base material in a chamber and using a vapor phase synthesis method such as CVD at a temperature of not less than 800° C. and not more than 1100° C. (at a temperature of not less than 800° C. and not more than 1050° C. in the case of MT (moderate temperature) method). In particular, a coating formed by CVD has a very large strength of adhesion to the base material, and therefore, the coating can be made thick and the wear resistance can be improved. Instead of CVD, physical vapor deposition such as ion plating or ion sputtering may also be used.

EXAMPLES

In the following, the present invention will be described in more detail in connection with Examples. The present invention, however, is not limited to them.

Example 1

As a base material, a cemented-carbide base material having the shape of the cutting tool of JIS B 4120 (1998) CNMG120408 defined by the JIS (Japanese Industrial Standards) was prepared. Regarding this base material, three base materials were prepared for each of Samples A1 to A6 described later herein, namely 18 base materials in total were prepared. The composition of this base material was made up of 89.0 mass % of WC, 8.0 mass % of Co, and 3.0 mass % of TiC.

Then, on the edge ridgeline of this base material, honing was performed by means of an SiC brush or the like. Subsequently, on the base material of each Sample (except for Sample A2) thus honed, shot peening was performed with SiC media. In contrast, no shot peening was performed on the base material of Sample A2. After this, the base material of each Sample (except for A1) was immersed in an alcohol liquid and ultrasonic waves with a frequency of 25 kHz and an output of 400 W were applied for 5 to 20 minutes. Next, on the surface of this base material, a coating was formed by means of CVD. The coating was deposited by first forming TiN having a thickness of 1.0 μm so that it contacts the base material surface, and successively forming, on the TiN, MT (moderate temperature)-TiCN having a thickness of 10.0 μm, TiN having a thickness of 1.0 μm, $Al_2O_3$ having a thickness of 4.0 μm, and TiN having a thickness of 1.5 μm in this order.

Each Sample (surface-coated cutting tools) was thus obtained, and one surface-coated cutting tool per Sample was cut along a plane including a normal to the coating surface at the center of the rake face and a geometric edge where two flank faces intersect, and the resultant cross section was mechanically polished. Then, the interface where the base material and the coating abutted on each other in the cross section exposed as a polished surface and the vicinity of the interface were observed with a scanning electron microscope at a magnification of 10000 to count the number of cracks that were present in the surface of the base material in the polished surface and measure the width of the crack. The results are shown in Table 1. In Table 1, the column "crack width" shows the average of measurements of widths of cracks with a width of 10 nm or more taken at ten positions, and the column "crack density" shows the number of cracks with a width of 10 to 200 nm in a 10 μm region in the surface of the base material.

Of the remaining surface-coated cutting tools that were not cut, one surface-coated cutting tool per Sample was used to evaluate the wear resistance under the following conditions. Further, of the remaining surface-coated cutting tools, one surface-coated cutting tool per Sample was used to evaluate the fracture resistance (chipping resistance) under the following conditions. The results are shown in Table 1 as well. It is noted that the fracture resistance was evaluated by measuring the time (impact time) that elapsed before occurrence of chipping or fracture.

<Evaluation of Wear Resistance>
Workpiece: SCM435 (JIS)
Cutting Speed: 300 m/min.
Feed: 0.3 mm/rev.
Cut: 1.5 nun
Cutting Oil: wet
Cutting Time: 20 min.
Evaluation: measure the amount of flank (face) wear (smaller numerical value of the wear amount indicates higher wear resistance)

<Evaluation of Fracture Resistance>
Workpiece: SCM435 (JIS), grooved material
Cutting Speed: 330 m/min.
Feed: 0.25 mm/rev.
Cut: 1.5 mm
Cutting Oil: Wet
Evaluation: time that elapsed before chipping or fracture (longer time indicates higher fracture resistance)

TABLE 1

|  | sample No. | shot peening | ultrasonic application time (min) | crack width (nm) | crack density (cracks/10 μm) | amount of flank wear (mm) | impact time (min) |
|---|---|---|---|---|---|---|---|
| Comparative | A1 | done | 0 | 50 | 0.5 | 0.15 | 2.3 |
| Example | A2 | not done | 5 | — | — | 0.15 | 1.4 |

TABLE 1-continued

|  | sample No. | shot peening | ultrasonic application time (min) | crack width (nm) | crack density (cracks/10 μm) | amount of flank wear (mm) | impact time (min) |
|---|---|---|---|---|---|---|---|
| Example | A3 | done | 5 | 110 | 2 | 0.16 | 5.6 |
|  | A4 | done | 10 | 150 | 5 | 0.17 | 6.3 |
|  | A5 | done | 15 | 180 | 7 | 0.17 | 5.4 |
| Comparative Example | A6 | done | 20 | 230 | 10 | 0.23 | 1.7 |

Figure 2:
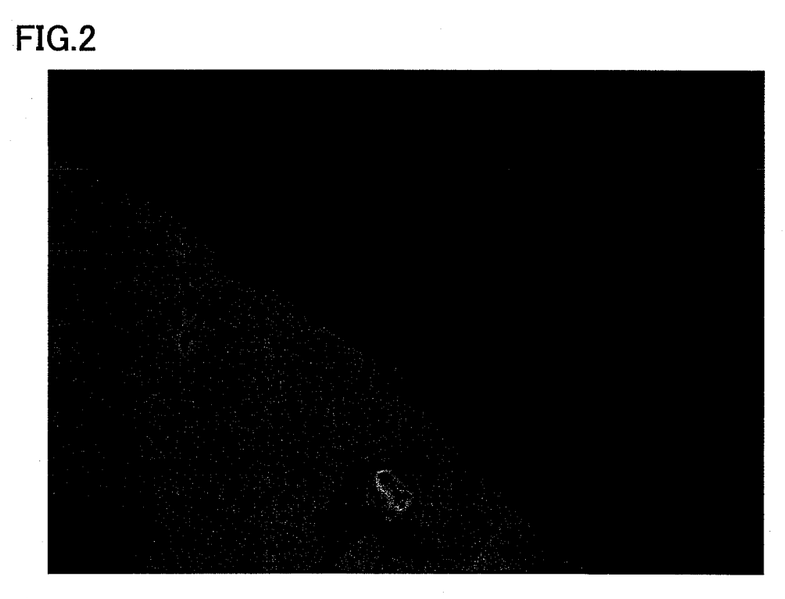
FIG. 2 shows a photomicrograph of the edge ridgeline portion and therearound of the surface-coated cutting tool of the present invention.

A photomicrograph (taken under the condition that a scanning electron microscope was used to take it at a magnification of 10000) of the above-described cross section of the surface-coated cutting tool of Sample A3 is shown in FIG. 2.

In Table 1, Samples A3 to A5 are Examples and Samples A1, A2, and A6 are Comparative Examples. As clearly seen from Table 1, regarding Samples A3 to A5 which are Examples of the present invention, while the amount of flank wear is substantially identical to that of Samples A1 and A2, the time elapsing before chipping or fracture ("impact time" in Table 1) is outstandingly longer than that of Samples A1 and A2. In contrast, as for Sample A6 as compared with Samples A3 to A5, the amount of flank wear is larger and the impact time is shorter. Thus, from the results above, the surface-coated cutting tool of the present invention can be confirmed as being excellent in both the wear resistance and the fracture resistance.

Example 2

As a base material, a cemented-carbide base material having the shape of the cutting tool of JIS B 4120 (1998) CNMG120408 defined by the JIS (Japanese Industrial Standards) was prepared. Regarding the base material, three base materials were prepared for each of Samples (B1 to B6) described later herein, namely 18 base Materials in total were prepared. The composition of this base material was made up of 88.0 wt % of WC, 5.0 wt % of Co, 3.0 wt % of TiC, 2.0 wt % of TaC, and 2.0 wt % of NbC.

Then, on the edge ridgeline portion of this base material, honing was performed by means of an SiC brush or the like.

Subsequently, on the base material of each Sample (except for Sample B2) thus honed, shot peening was performed with SiC media. In contrast, no shot peening was performed on the base material of Sample B2. After this, the base material of each Sample was immersed in an alcohol liquid and ultrasonic waves with a frequency of 25 kHz and an output of 200 to 700 W were applied for 10 minutes. Next, on the surface of this base material, a coating was formed. This coating was deposited by means of CVD by first forming TiN having a thickness of 0.5 μm so that it contacts the base material surface, and successively forming, on the TiN, MT-TiCN having a thickness of 10.0 μm, TiBN having a thickness of 1.0 μm, $Al_2O_3$ having a thickness of 6.0 μm, and TiN having a thickness of 1.5 μm in this order.

Each Sample (surface-coated cutting tools) was thus obtained, and one surface-coated cutting tool per Sample was cut along a plane including a normal to the coating surface at the center of the rake face and a geometric edge where two flank faces intersect, and the resultant cross section was mechanically polished. Then, the coating in the cross section exposed as a polished surface was observed with a scanning electron microscope at a magnification of 10000 to count the number of cracks that were present in the surface of the polished plane and further measure the width of the crack. The results are shown in Table 2. In Table 2, the column "crack width" shows the average of measurements of widths of cracks with a width of 10 nm or more taken at ten positions, and the column "crack density" shows the number of cracks with a width of 10 to 200 nm in a 10 μm region in the surface of the base material.

Of the remaining surface-coated cutting tools that were not cut, one surface-coated cutting tool per Sample was used to evaluate the wear resistance under the same conditions as Example 1. Further, of the remaining surface-coated cutting tools, one surface-coated cutting tool per Sample was used to evaluate the fracture resistance (chipping resistance) under the same conditions as Example 1. The results are shown in Table 2 as well.

TABLE 2

|  | sample No. | shot peening | ultrasonic output (W) | crack width (nm) | crack density (cracks/10 μm) | amount of flank wear (mm) | impact time (min) |
|---|---|---|---|---|---|---|---|
| Comparative Example | B1 | done | 200 | 70 | 1 | 0.15 | 2.0 |
|  | B2 | not done | 300 | — | — | 0.15 | 1.0 |
| Example | B3 | done | 300 | 90 | 3 | 0.14 | 4.5 |
|  | B4 | done | 500 | 170 | 5 | 0.16 | 5.3 |
|  | B5 | done | 600 | 180 | 7 | 0.17 | 4.4 |
| Comparative Example | B6 | done | 700 | 230 | 10 | 0.20 | 1.3 |

In Table 2, Samples B3 to B5 are Examples and Samples B1, B2, and B6 are Comparative Examples. As clearly seen from Table 2, regarding Samples B3 to B5 which are Examples of the present invention, while the amount of flank wear is substantially identical to that of Samples B1 and B2, the time elapsing before chipping or fracture ("impact time" in Table 2) is outstandingly longer than that of Samples B1 and B2. In contrast, as for Sample B6 as compared with Samples B3 to B5, the amount of flank wear is larger and the impact time is shorter. Thus, from the results above, the surface-coated cutting tool of the present invention can be confirmed as being excellent in both the wear resistance and the fracture resistance.

Example 3

As a base material, a cemented-carbide base material having the shape of the cutting tool of JIS B 4120 (1998) CNMG120408 defined by the JIS (Japanese Industrial Standards) was prepared. Regarding this base material, three base materials were prepared for each of Samples C1 to C6 described later herein, namely 18 base materials in total were prepared. The composition of this base material was made up of 89.0 mass % of WC, 8.0 mass % of Co, and 3.0 mass % of TiC.

Then, on the edge ridgeline of this base material, honing was performed by means of an SiC brush or the like. Subsequently, on the base material of each Sample (except for Sample C2) thus honed, shot peening was performed with alumina media. In contrast, no shot peening was performed on the base material of Sample C2. After this, the base material of each Sample (except for C1) was immersed in an alcohol liquid and ultrasonic waves with a frequency of 25 kHz and an output of 700 W were applied for 0 to 35 minutes. Next, on the surface of this base material, a coating was formed by means of CVD.

Figure 3:
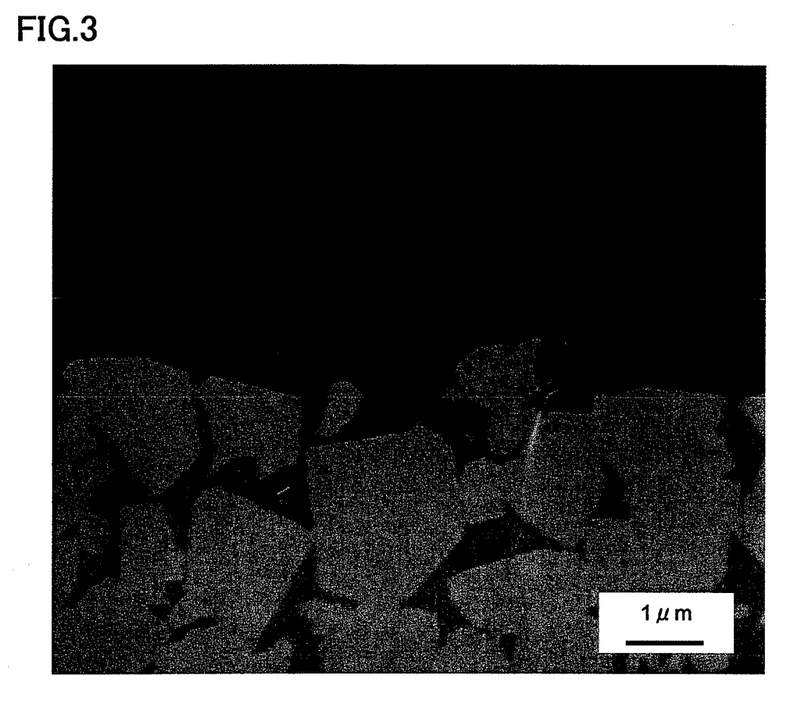
FIG. 3 shows a photomicrograph of the edge ridgeline portion and therearound of the surface-coated cutting tool of the present invention.

Each Sample (surface-coated cutting tools) was thus obtained, and one surface-coated cutting tool per Sample was cut along a plane including a normal to the coating surface at the center of the rake face and a geometric edge where two flank faces intersect, and the resultant cross section was mechanically polished. Then, the interface where the base material and the coating abutted on each other in the cross section exposed as a polished surface and the vicinity of the interface were observed with a scanning electron microscope at a magnification of 10000 to measure the diameter and count the number of pores present in the surface of the base material in the polished surface. The results are shown in Table 3. In Table 3, the column "pore diameter" shows the average of measured diameters of ten pores, and the column "pore density" shows the number of pores in a region of 10 µm in length in the surface of the base material. A photomicrograph (taken under the condition that a scanning electron microscope was used to take it at a magnification of 10000) of the above-described cross section of the surface-coated cutting tool of Sample C3 is shown in FIG. 3.

Of the remaining surface-coated cutting tools that were not cut, one surface-coated cutting tool per Sample was used to evaluate the wear resistance under the following conditions. Further, of the remaining surface-coated cutting tools, one surface-coated cutting tool per Sample was used to evaluate the fracture resistance (chipping resistance) under the following conditions. The results are shown in Table 3 as well. It is noted that the fracture resistance was evaluated by measuring the time (impact time) that elapsed before occurrence of chipping or fracture.

<Evaluation of Wear Resistance>
Workpiece: SCM435 (JIS)
Cutting Speed: 300 m/min.
Feed: 0.3 mm/rev.
Cut: 1.5 mm
Cutting Oil: dry
Cutting Time: 20 min.
Evaluation: measure the amount of flank wear (smaller numerical value of the wear amount indicates higher wear resistance)

<Evaluation of Fracture Resistance>
Workpiece: SCM435 (JIS), grooved material
Cutting Speed: 300 m/min.
Feed: 0.25 mm/rev.
Cut: 1.5 mm
Cutting Oil: Wet
Evaluation: time that elapsed before chipping or fracture (longer time indicates higher fracture resistance)

TABLE 3

| | sample No. | shot peening | ultrasonic application time (min) | pore diameter (nm) | pore density (pores/10 µm) | amount of flank wear (mm) | impact time (min) |
|---|---|---|---|---|---|---|---|
| Comparative Example | C1 | done | 0 | 0.05 | 1.6 | 0.20 | 2.7 |
| Example | C2 | not done | 10 | — | — | 0.19 | 2.6 |
| | C3 | done | 10 | 0.15 | 3.2 | 0.18 | 5.8 |
| | C4 | done | 25 | 1.3 | 5.1 | 0.19 | 6.2 |
| | C5 | done | 30 | 2.8 | 8.4 | 0.18 | 5.5 |
| Comparative Example | C6 | done | 35 | 3.3 | 13 | 0.22 | 2.0 |

In Table 3, Samples C3 to C5 are Examples and Samples C1, C2, and C6 are Comparative Examples. As clearly seen from Table 3, regarding Samples C3 to C5 which are Examples of the present invention, while the amount of flank wear is substantially identical to that of Samples C1 and C2, the time elapsing before chipping or fracture ("impact time" in Table 3) is outstandingly longer than that of Samples C1 and C2. In contrast, as for Sample C6 as compared with Samples C3 to C5, the amount of flank wear is larger and the impact time is shorter. Thus, from the results above, the surface-coated cutting tool of the present invention can be confirmed as being excellent in both the wear resistance and the fracture resistance.

Example 4

As a base material, a cemented-carbide base material having the shape of the cutting tool of JIS B 4120 (1998) CNMG120408 defined by the JIS (Japanese Industrial Standards) was prepared. Regarding this base material, three base materials were prepared for each of Samples (D1 to D6) described later herein, namely 18 base materials in total were prepared. The composition of this base material was made up of 88.0 wt % of WC, 5.0 wt % of Co, 3.0 wt % of TiC, 2.0 wt % of TaC, and 2.0 wt % of NbC.

Then, on the edge ridgeline of this base material, honing was performed by means of an SiC brush or the like. Subsequently, on the base material of each Sample (except for Sample D2) thus honed, shot peening was performed with alumina media. In contrast, no shot peening was performed on the base material of Sample D2. After this, the base material of each Sample was immersed in an alcohol liquid and ultrasonic waves with a frequency of 25 kHz and an output of 500 to 1000 W were applied for 15 minutes. Next, on the surface of this base material, a coating was formed by means of CVD. This coating was deposited by first forming TiN having a thickness of 0.5 μm so that it contacts the base material surface, and successively forming, on the TiN, MT-TiCN having a thickness of 10.0 μm, TiBN having a thickness of 1.0 μm, $Al_2O_3$ having a thickness of 6.0 μm, and TiN having a thickness of 1.5 μm in this order.

Each Sample (surface-coated cutting tools) was thus obtained, and one surface-coated cutting tool per Sample was cut along a plane including a normal to the coating surface at the center of the rake face and a geometric edge where two flank faces intersect, and the resultant cross section was mechanically polished. Then, the coating in the cross section exposed as a polished surface was observed with a scanning electron microscope at a magnification of 10000 to count the number of pores present in the surface of the polished plane and further measure the diameter of the pore. The results are shown in Table 4. In Table 4, the column "pore diameter" shows the average of measured diameters of ten pores, and the column "pore density" shows the number of pores in a region of 10 μm in length in the surface of the base material.

Of the remaining surface-coated cutting tools that were not cut, one surface-coated cutting tool per Sample was used to evaluate the wear resistance under the same conditions as Example 3. Further, of the remaining surface-coated cutting tools, one surface-coated cutting tool per Sample was used to evaluate the fracture resistance (chipping resistance) under the same conditions as Example 3. The results are shown in Table 4 as well.

TABLE 4

| | sample No. | shot peening | ultrasonic output (W) | pore diameter (nm) | pore density (pores/10 μm) | amount of flank wear (mm) | impact time (min) |
|---|---|---|---|---|---|---|---|
| Comparative Example | D1 | done | 500 | 0.06 | 1.3 | 0.17 | 2.3 |
| | D2 | not done | 600 | — | — | 0.18 | 2.1 |
| Example | D3 | done | 600 | 0.7 | 2.1 | 0.16 | 4.8 |
| | D4 | done | 800 | 1.5 | 5.3 | 0.17 | 5.5 |
| | D5 | done | 900 | 2.3 | 8.8 | 0.18 | 5.0 |
| Comparative Example | D6 | done | 1000 | 2.8 | 12 | 0.21 | 1.5 |

In Table 4, Samples D3 to D5 are Examples and Samples D1, D2, and D6 are Comparative Examples. As clearly seen from Table 4, regarding Samples D3 to D5 which are Examples of the present invention, while the amount of flank wear is substantially identical to Samples D1 and D2, the time elapsing before chipping or fracture ("impact time" in Table 4) is outstandingly longer than Samples D1 and D2. In contrast, as for Sample D6 as compared with Samples D3 to D5, the amount of flank wear is larger and the impact time is shorter. Thus, from the results above, the surface-coated cutting tool of the present invention can be confirmed as being excellent in both the wear resistance and the fracture resistance.

While the embodiments and examples of the present invention have heretofore been described, it is originally intended to appropriately combine the features of the above-described embodiments and examples each.

It should be construed that the embodiments and examples disclosed herein are by way of illustration in all respects, not by way of limitation. It is intended that the scope of the present invention is defined by claims, not by the description above, and encompasses all modifications and variations equivalent in meaning and scope to the claims.

Industrial Applicability

The surface-coated cutting tool of the present invention is suitable for cutting work where a load is intermittently applied, such as milling or machining of a grooved material.

Reference Signs List

1 base material; 2 coating; 3 rake face; 4 flank face; 5 edge ridgeline; 10 surface-coated cutting tool

The invention claimed is:

1. A surface-coated cutting tool comprising a base material and a coating formed on the base material,
said base material having a hard phase and a binder phase binding the hard phases to each other,
said coating being formed of a single layer or a plurality of layers,
La being less than 0.2 mm and Lb being less than 0.1 mm, where point a is a position located away from an edge ridgeline toward a rake face by a distance of said La and point b is a position located away from the edge ridgeline toward a flank face by a distance of said Lb in a cross section of said surface-coated cutting tool cut along a plane including a normal to a surface of said coating at a center of the rake face and a geometric edge where two flank faces intersect; and a region of 10 μm in a surface of said base material from point a' to point b' has two to seven cracks with a width of not more than 200 nm, or two to ten pores are present per length of 10 μm in the surface of said base material from said point a' to said point b', where said point a' is a point on the surface of said base material that is located perpendicularly from said point a and said point b' is a point on the surface of said base material that is located perpendicularly from said point b, and
said pore being a cavity with a diameter gradually decreasing toward an interface between said base material and said coating, and said pore having a diameter in said interface of 0.08 to 3 μm.

2. The surface-coated cutting tool according to claim 1, wherein said La is less than 0.1 mm.

3. The surface-coated cutting tool according to claim 1, wherein said Lb is less than 0.05 mm.

4. The surface-coated cutting tool according to claim 1, wherein a region of 10 μm in the surface of said base material from said point a' to said point b' has three to five said cracks.

5. The surface-coated cutting tool according to claim 1, wherein two to six pores are present per region with a length of 10 μm in the surface of said base material from said point a' to said point b'.

6. The surface-coated cutting tool according to claim 1, wherein said coating is formed of a compound of at least one element selected from the group consisting of group IVa elements, group Va elements, group VIa elements in the periodic table, Al, and Si, and at least one element selected from the group consisting of carbon, nitrogen, oxygen, and boron.

7. The surface-coated cutting tool according to claim 1, wherein said coating has a thickness of not less than 3 μm and not more than 30 μm.

8. The surface-coated cutting tool according to claim 1, wherein said hard phase is formed of tungsten carbide and at least one compound selected from the group consisting of a carbide, a nitride, and a carbonitride of a group IVa element, a group Va element, or a group VIa element in the periodic table.

9. The surface-coated cutting tool according to claim 1, wherein said hard phase is formed of tungsten carbide.

10. The surface-coated cutting tool according to claim 1, wherein said binder phase is formed of at least one element selected from the group consisting of iron, cobalt, and nickel.

* * * * *